United States Patent
Kamins et al.

(10) Patent No.: US 7,582,975 B1
(45) Date of Patent: Sep. 1, 2009

(54) NANOWIRE DEVICE AND METHOD OF MAKING THE SAME

(75) Inventors: Theodore I. Kamins, Palo Alto, CA (US); Philip J. Kuekes, Palo Alto, CA (US); Carrie L. Donley, Chapel Hill, NC (US); Jason J. Blackstock, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 45 days.

(21) Appl. No.: 11/741,218

(22) Filed: Apr. 27, 2007

Related U.S. Application Data

(63) Continuation-in-part of application No. 11/583,648, filed on Oct. 19, 2006.

(51) Int. Cl.
*H01L 29/40* (2006.01)

(52) U.S. Cl. .................. 257/785; 257/414; 977/762; 977/765

(58) Field of Classification Search .............. 257/785, 257/414; 977/762, 765
See application file for complete search history.

(56) References Cited

U.S. PATENT DOCUMENTS

| | | | |
|---|---|---|---|
| 6,962,823 B2 | 11/2005 | Empedocles et al. | |
| 7,069,372 B1 | 6/2006 | Leung, Jr. et al. | |
| 7,132,275 B2 | 11/2006 | Reich et al. | |
| 7,186,381 B2 | 3/2007 | Penner et al. | |
| 7,312,155 B2 * | 12/2007 | Dubin et al. ............. | 438/694 |
| 2005/0133476 A1 | 6/2005 | Islam et al. | |
| 2006/0097389 A1 | 5/2006 | Islam et al. | |
| 2006/0172126 A1 | 8/2006 | Long et al. | |

OTHER PUBLICATIONS

Islam, et al., "A Novel Interconnection Technique for Manufacturing Nanowire Devices", Appl. Phys. A 80 (2005), pp. 1133-1140.

Islam, et al., "Ultrahigh-Density Silicon Nanobridges Formed Between Two Vertical Silicon Surfaces", Nanotechnology 15 (2004), pp. L5-L8.

* cited by examiner

*Primary Examiner*—Douglas M Menz

(57) ABSTRACT

A nanowire device includes a nanowire formed between two surfaces, and a gap formed at a predetermined location in the nanowire.

20 Claims, 2 Drawing Sheets

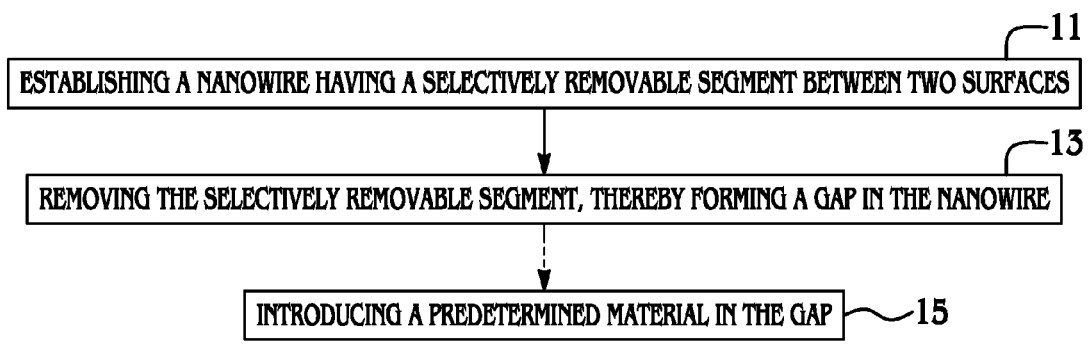
FIG. 1
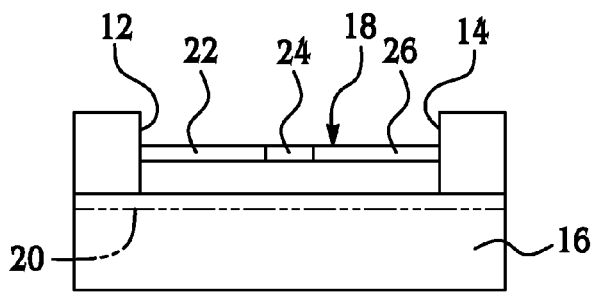
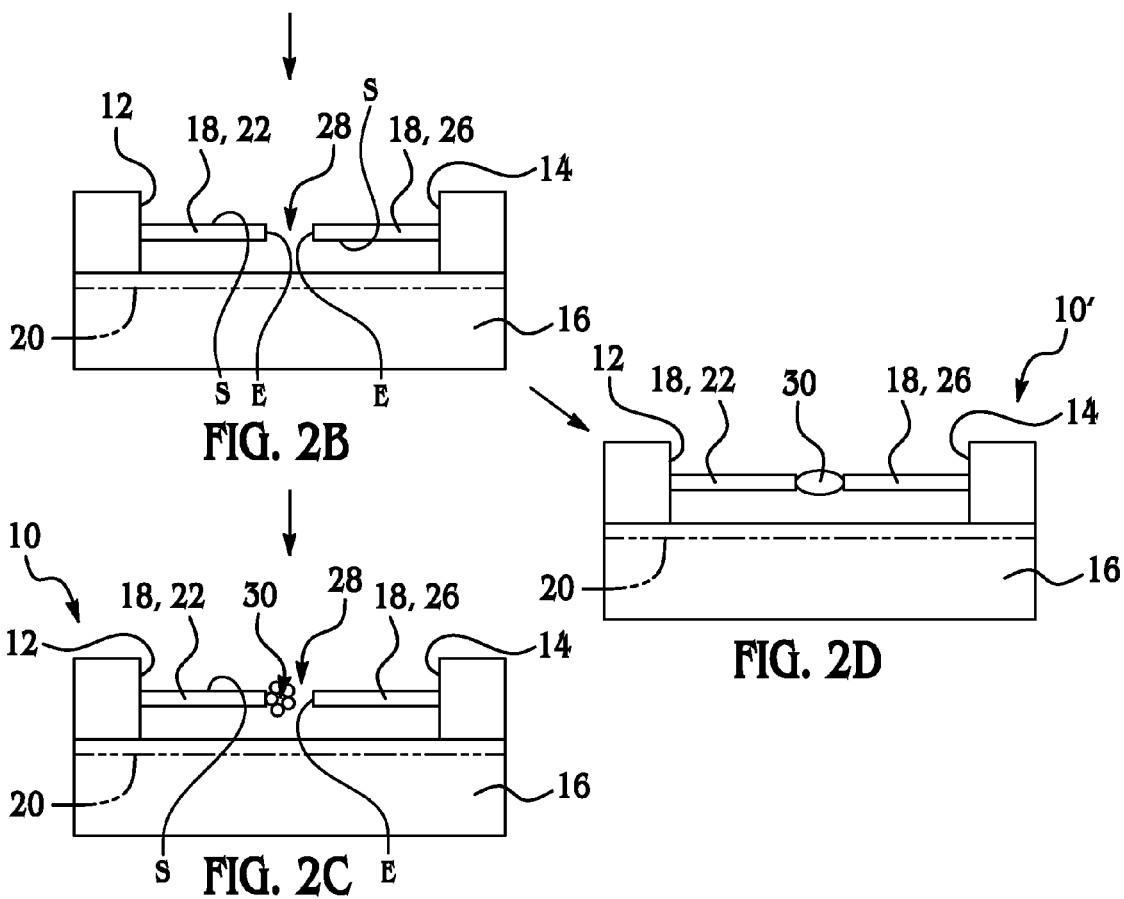

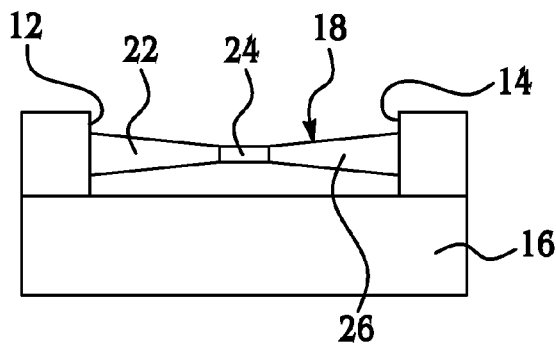
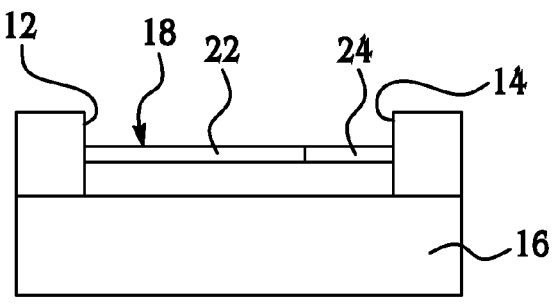
FIG. 3    FIG. 4
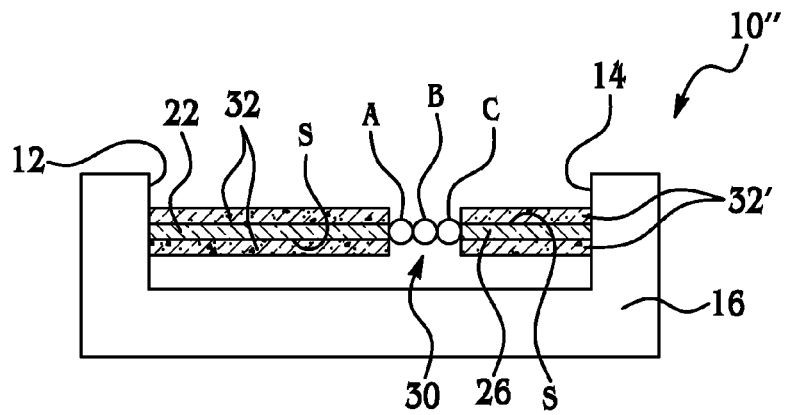
FIG. 5
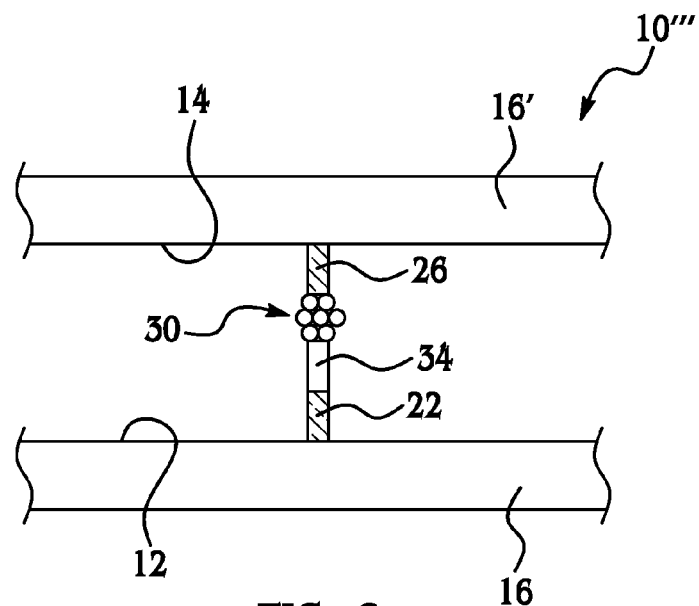
FIG. 6

NANOWIRE DEVICE AND METHOD OF MAKING THE SAME

CROSS-REFERENCE TO RELATED APPLICATIONS

This application is a continuation-in-part of co-pending U.S. patent application Ser. No. 11/583,648, filed Oct. 19, 2006, entitled "Sensor and Method for Making the Same," which application is incorporated by reference herein in its entirety.

STATEMENT REGARDING FEDERALLY SPONSORED RESEARCH OR DEVELOPMENT

This invention was made in the course of research partially supported by the Defense Advanced Research Projects Agency, Agreement No. HR0011-05-3-0001. The U.S. government has certain rights in the invention.

BACKGROUND

The present disclosure relates generally to nanowire devices and methods of making the same.

Since the inception of semiconductor technology, a consistent trend has been toward the development of smaller device dimensions and higher device densities. As a result, nanotechnology has seen explosive growth and generated considerable interest. Nanotechnology is centered on the fabrication and application of nano-scale structures, or structures having dimensions that are often 5 to 100 times smaller than conventional semiconductor structures. Nanowire devices are included in the category of nano-scale structures.

Nanowires are wire-like structures having diameters on the order of about 1 nm to about 100 nm. Nanowires are suitable for use in a variety of applications, including functioning as conventional wires for interconnection applications, as semiconductor devices, and as sensors. While holding much promise, the practical application of nanowires has been somewhat limited. In particular, mechanical and electro-migration based techniques for producing gaps or break junctions in the nanowire are generally not reproducible. Furthermore, such techniques generally do not enable accurate control over the size and/or position of the gap or break junction.

BRIEF DESCRIPTION OF THE DRAWINGS

Features and advantages of embodiment(s) of the present disclosure will become apparent by reference to the following detailed description and drawings, in which like reference numerals correspond to similar, though not necessarily identical components. For the sake of brevity, reference numerals or features having a previously described function may not necessarily be described in connection with other drawings in which they appear.

FIG. 1 is a flow diagram depicting an embodiment of a method for forming an embodiment of a nanowire device;

FIGS. 2A through 2C depict a schematic flow diagram of an embodiment of the method for forming one embodiment of the nanowire device;

FIGS. 2A, 2B and 2D depict a schematic flow diagram of an embodiment of the method for forming another embodiment of the nanowire device;

FIG. 3 depicts a schematic view of another embodiment of the nanowire device prior to removal of a selectively removable segment;

FIG. 4 depicts a schematic view of still another embodiment of the nanowire device prior to removal of a selectively removable segment;

FIG. 5 depicts a schematic view of an embodiment of the nanowire device having a protective layer established on the nanowire segments; and FIG. 6 depicts a schematic, cut-away view of still another embodiment of the nanowire device having a vertical nanowire.

DETAILED DESCRIPTION

Embodiments of the nanowire device disclosed herein include a gap or break junction. Such devices may be suitable for a variety of applications, including, but not limited to, low-voltage electron emission. Embodiments of the method for forming the nanowire device enable control over the length and position of the gap. As such, the gap may be substantially precisely positioned at a predetermined location along the nanowire. As used herein, the phrase "predetermined location" means that each segment (including a removable segment and the gap) of the nanowire is substantially precisely and controllably formed and aligned with respect to each of the other segments. It is believed that such substantially precise gap positioning has not previously been achieved. Such control advantageously results in devices having desirably positioned gaps and materials, and in device elements that are reproducible.

In some embodiments, a material of interest is positioned within at least a portion of the gap or break junction. The range of materials that may be positioned in the gap make the device suitable for a variety of applications, including, but not limited to sensing applications, studying molecules, electrical applications (e.g., diodes), chemical applications, photo/opto-electronic applications, low voltage electron emission, and/or the like, and/or combinations thereof.

Referring now to FIG. 1, an embodiment of the method for forming the nanowire device is depicted. Generally, the method includes establishing a nanowire having a selectively removable segment between two surfaces, as shown at reference numeral 11. The method also includes removing the selectively removable segment, thereby forming a gap in the nanowire, as shown at reference numeral 13. Some embodiments of the method also include introducing a predetermined material in the gap, as shown at reference numeral 15. It is to be understood that these and other embodiments of the method and device are described in further detail in reference to the other figures hereinbelow.

Referring now to FIGS. 2A through 2D together, embodiments of the method for forming embodiments of the nanowire device 10, 10' are shown. FIG. 2C depicts one embodiment of the device 10, and FIG. 2D depicts another embodiment of the device 10'.

FIG. 2A depicts two surfaces 12, 14 positioned on a substrate 16, and the nanowire 18 formed laterally between the two surfaces 12, 14. It is to be understood that the nanowire 18 may also be formed vertically between two surfaces 12, 14 (see FIG. 6). The surfaces 12, 14 may be post surfaces, electrode surfaces, trench sidewalls, recess sidewalls, or combinations thereof. It is to be understood that the surfaces 12, 14 from which the nanowires 18 are grown often have (111) planes of the crystal lattice. In some embodiments, the materials used to form the surfaces 12, 14 generally also have (110) crystal lattice planes, at least some of which are oriented substantially perpendicular to the (111) crystal lattice planes of the surfaces 12, 14.

It is to be understood that (111) surfaces may be selected, at least in part, because nanowires 18 often grow in (111) directions. However, under some conditions (e.g., materials and diameters), the nanowires 18 grow in other directions. In the latter situation, surfaces that are perpendicular to the nanowire 18 growth direction may be more suitable if nanowires perpendicular to the surface are desirable.

In the embodiment shown in FIG. 2A, the surfaces 12, 14 are formed from a layer of silicon (Si) cut or polished with a top surface plane being a (110) crystal lattice plane. As a non-limiting example, the silicon layer may be a top layer of a silicon-on-insulator (SOI) substrate. As other non-limiting examples, the surfaces 12, 14 are formed from germanium or gallium arsenide. In FIG. 2A, the (110) plane is considered to be horizontally oriented with respect to the Cartesian coordinate system. The surfaces 12, 14 from which the nanowire 18 is formed further has (111) planes of the Si crystal lattice, at least some of which are approximately perpendicular to, and intersect with the horizontally oriented (110) surface. The (110) Si layer may be etched anisotropically using an etchant, such as KOH. The (111) planes etch slowly compared to other crystal planes; as such, the resulting structure, which forms the surfaces 12, 14, is bounded by vertical (111) planes. These (111) planes form the substantially vertical surfaces 12, 14.

As used herein, the term "horizontal" generally refers to a direction or a plane that is parallel with a surface of the substrate 16 or wafer, while the term "vertical" generally refers to a direction or plane that is substantially or approximately perpendicular to the substrate surface. It is to be understood that the specific use of the terms "horizontal" and "vertical" to describe relative characteristics is to facilitate discussion and is not intended to limit embodiments of the present disclosure.

In one embodiment, the surfaces 12, 14 may have first and second conductivity types. It is to be understood that the first and second conductivity types may be the same or different. In a non-limitative example, the first conductivity type is p-type conductivity, and the second conductivity type is n-type conductivity, or vice versa. In other embodiments, both the first and second conductivity types are p-type conductivity or n-type conductivity.

The surfaces 12, 14 may also be electrically isolated from each other except through, in some embodiments, the nanowire 18. If the substrate 16 is formed of an insulating material, the surfaces 12, 14, are electrically isolated from each other via the substrate 16. If the substrate 16 is formed of a conductive or a semi-conductive material, an insulating layer 20 may be established between the respective surfaces 12, 14 and the substrate 16 to electrically isolate the surfaces 12, 14 from each other.

As shown in FIG. 2A, the nanowire 18 is grown substantially laterally between the surfaces 12, 14. In an embodiment, growth of the nanowire 18 is initiated at one of the surfaces 12, 14, and a connection is formed at the other of the surfaces 14, 12. Such growth may be initiated via a catalyst (e.g., gold, titanium, platinum, palladium, gallium, nickel, or combinations thereof) and a precursor gas. It is to be understood, however, that the nanowire 18 may be formed via any suitable method. A non-limitative example of forming a lateral nanowire 18 is described in U.S. patent application Ser. No. 10/738,176, filed on Dec. 17, 2003 (U.S. Publication No. 2005/0133476 A1, published Jun. 23, 2005), which is incorporated herein by reference in its entirety. Other example methods for forming lateral nanowires 18 are described in "Ultrahigh-density silicon nanobridges formed between two vertical silicon surfaces" by Islam et al., published in 2004 in volume 15 of *Nanotechnology* at pages L5-L8; and "A novel interconnection technique for manufacturing nanowire devices" by Islam et al., published in 2005 in volume 80 of *Appl. Phys. A* at pages 1133-1140, both of which are incorporated herein by reference.

As previously indicated, the nanowire 18 may also be grown vertically between two surfaces 12, 14 (see, e.g., FIG. 6). Such growth may be initiated via a catalyst and a precursor gas, or via any other suitable method. An example of the formation of vertical nanowires is further described in U.S. patent application Ser. No. 10/982,051, filed on Nov. 5, 2004 (U.S. Publication No. 2006/0097389, published May 11, 2006), incorporated by reference herein in its entirety.

As depicted in FIG. 2A, the nanowire 18 has at least three segments 22, 24, 26, one of which is selectively removable compared to the others. As the nanowire 18 grows, it may be doped at predetermined areas with a dopant that is capable of introducing different conductivity types or different materials to one or more of the nanowire segments 22, 24, 26. One of the segments 24 of the nanowire 18 is formed of a different material (from the other segments 22, 26) or is doped differently (compared to the other segments 22, 26) to form the selectively removable segment.

In the embodiment shown in FIG. 2A, the selectively removable segment 24 is positioned between first and second nanowire segments 22, 26. The first segment 22 is grown from surface 12 (using methods previously described) and is formed of a first material. It is to be understood that the first segment 22 may be any suitable length, and growth is continued until such length is achieved. Generally, the length of the first segment 22 depends, at least in part, on the desirable position of the gap 28 (see FIG. 2B) in the nanowire 18. For example, if it is desirable that the gap 28 be formed at a position equidistant from both posts 12, 14, the first segment 22 of the nanowire 18 is grown to a predetermined distance measured from the center point between the two surfaces 12, 14. In this example, the predetermined distance from the center point will depend, at least in part, on the desirable length for the gap 28. In some embodiments, the first segment 22 will be longer than the second segment 26, and in other embodiments, the second segment 26 will be longer than the first segment 22.

Referring again to FIG. 2A, once the first segment 22 is grown to a desirable length, the method includes changing the material composition and/or dopant concentration of the growing nanowire 18 to form the selectively removable segment 24 at the end of the first segment 22. Since the selectively removable segment 24 has a different composition and/or dopant concentration than the other nanowire segments 22, 26, it is to be understood that the selectively removable segment 24 has an etch rate that is different from an etch rate of each first and second nanowire segments 22, 26.

As previously stated, in one embodiment, the selectively removable segment 24 is formed of a different material than the other segments 22, 26. As non-limiting examples, the selectively removable segment 24 may be formed of germanium or III-V materials, while the other segments 22, 26 are formed of silicon. As another non-limiting example, the selectively removable segment may be formed of InGaAs, while the other segments 22, 26 are formed of InAs. It is to be understood that any desirable combinations of materials may be used for the segments 22, 24, 26, as long as one of the segments 24 is selectively removable from the other segments 22, 26.

In another embodiment, the selectively removable segment 24 is a lightly doped segment (e.g., silicon) between two heavily doped segments (e.g., silicon heavily doped with boron). The lightly doped segment may be etched preferentially with respect to the heavily doped segments, for example using KOH.

The growth process with the second material composition and/or dopant concentration continues until the selectively removable segment 24 is grown to a desirable length. Since the selectively removable segment 24 is ultimately removed to form the gap 28 (see FIG. 2B), the length of the segment 24 corresponds to the length of the gap 28.

As shown in FIG. 2A, after the selectively removable segment 24 is grown to a desirable length, the composition and/or dopant concentration is changed and growth is continued to form the second nanowire segment 26. It is to be understood that, as previously described, the second nanowire segment 26 is formed of a material or with a dopant concentration that has a different etch rate than the selectively removable segment 24. It is to be further understood that the first and second nanowire segments 22, 26 may be formed of the same or different materials, of the same or different conductivity type, and/or of the same or different dopant concentration.

Generally, the nanowire segments 22, 26 are selected from metals, semi-conductor materials, or combinations thereof. Non-limiting examples of such materials include silicon, germanium, indium phosphide, gallium arsenide, boron, or the like, or combinations thereof. Furthermore, dopants for introducing p-type conductivity into group IV semi-conductors include, but are not limited to boron, other like elements, or combinations thereof; and dopants for introducing n-type conductivity into group IV semi-conductors include, but are not limited to phosphorus, arsenic, antimony, other like elements, or combinations thereof. Different dopants may be suitable for group III-V materials, such as, for example gallium arsenide.

In this embodiment, the second nanowire segment 26 connects to the surface 14. While two nanowire segments 22, 26 are shown in FIG. 2A, it is to be understood that in any of the embodiments disclosed herein, any desirable number of non-selectively removable segments 22, 26 may be formed. Furthermore, the length of each segment 22, 26 may be varied in order to form the gap 28 in a desirable position. As a non-limiting example, the growth of the first segment 22 may be stopped to grow another segment of a different material prior to formation of the selectively removable segment 24. Likewise, the growth of the second segment 26 may be stopped to grow another segment of a different material prior to attaching to the surface 14. In this example embodiment, the nanowire 18 has five different segments, one of which is the selectively removable segment 24.

Referring now to FIG. 2B, an embodiment of the method includes removing the selectively removable segment 24 to form the gap 28. Any suitable etching process that is selective to the segment 24, and will not deleteriously affect the nanowire segments 22, 26 may be used. Non-limiting examples of such removal processes include etching with sulfuric acid to selectively remove a germanium segment substantially without deleteriously affecting silicon segments, or etching with KOH to selectively remove a lightly doped silicon segment substantially without deleteriously affecting heavily boron doped silicon segments.

As previously indicated, the gap 28 has a length corresponding to the length of the selectively removable segment 24. As such, the length of the gap 28 may be controlled by controlling the length of the selectively removable segment 24 during growth. It is to be understood that the length of the gap 28 may be much longer or somewhat shorter than the diameter of the nanowire segments 22, 26. In one embodiment, the length of the gap 28 is of the same or of a similar (e.g., two or three times) order as the diameter of the nanowire segments 22, 26. In a non-limiting example, the length of the gap 28 is less than 1 μm. In another non-limiting example, the length of the gap 28 is equal to or less than 100 nm. In still another non-limiting example, the length of the gap ranges from about 1 nm to about 20 nm. As the length is controllable, it may be varied as desired. In some instances, the selected length depends, at least in part, on the predetermined material 30 (see FIGS. 2C and 2D) to be formed in the gap 28, the application for which the device 10, 10' (see FIGS. 2C and 2D, respectively) will be used, or combinations thereof.

FIG. 2B depicts the location of the gap 28 substantially at the center of the nanowire 18. It is to be understood however, that the gap 28 may be positioned anywhere along the nanowire 18 (e.g., closer to one of the surfaces 12, 14 than to the other of the surfaces 14, 12). As previously described hereinabove, the gap 28 position may be controlled, at least in part, by controlling the length of the first segment 22 during growth.

Nanowires 18 with a high aspect ratio of length to diameter (e.g., at least 1000:1) may be suitable for embodiments of the device 10 (FIG. 2C), 10' (FIG. 2D), 10" (FIG. 5), 10''' (FIG. 6) disclosed herein. Such high aspect ratio nanowires 18 may be grown successfully in the flowing gas of a chemical vapor deposition reactor without substantial distortion of the nanowires 18. However, immersion in a liquid (e.g., an etchant for removal of the selectively removable segment 24 or a fluid for addition of the predetermined material 30) subjects the nanowires 18 to significant force(s) that may deleteriously affect (i.e., distort, destroy, etc.) the nanowires 18. In one embodiment, the nanowires 18 may be made more mechanically stable by limiting their aspect ratio. However, in some instances, this may also limit access to the device 10, 10', 10", 10''' by additional species. In another embodiment, as shown in FIG. 3, the segments 22, 26 may be formed such that they are broader near their respective connections to the surfaces 12, 14, and narrower near the selectively removable segment 24. It is believed that a relatively small nanowire segment diameter adjacent to the gap 28 may be desirable for limiting the number of molecules or other species that may be introduced into the gap 28.

The diameter of the nanowire segments 22, 26 may be adjusted along the length of the nanowire 18 by any suitable technique. In one embodiment, the nanowire diameter depends, at least in part, on the total pressure of the deposition chamber. Therefore, the pressure may be adjusted during the growth of the first segment 22 to decrease the diameter of the nanowire 18 as it grows axially. As such, the largest diameter of the segment 22 is near the connection to the surface 12, and the smallest diameter is located at the end E (see FIGS. 2B and 2C) adjacent to the selectively removable segment 24. Similarly, after the selectively removable segment 24 is grown, the pressure may be adjusted in the opposite direction as the segment 26 grows, such that the diameter of segment 26 increases as the segment 26 grows toward the surface 14. It is to be understood that the optimal variation in pressure depends, at least in part, on the particular deposition system, materials, and processing conditions used.

In another embodiment, the composition of the reactant gases may be varied during the growth of the segments 22, 26. As a non-limiting example, for a silicon nanowire, the ratio of catalyzed to uncatalyzed deposition of silicon depends on the ratio of silane to chlorine-containing gas (e.g., gaseous HCl) in the reaction chamber. As the nanowire segment 22 continues to grow axially by catalyzed deposition, uncatalyzed growth occurs radially along the sides S (see FIGS. 2B and 2C) of the previously grown portions of the nanowire segment 22. The initially grown portion of segment 22 is exposed to the uncatalyzed growth for a longer period of time, and the diameter of this segment 22 is greatest near the surface 12, and is smallest near the growing end. Consequently, the nanowire segment 22 may have a tapered shape that depends, at least in part, on the ratio of catalyzed to uncatalyzed growth. As shown in FIG. 3, the diameter is smallest adjacent to the selectively removable segment 24. The segment 26 of FIG. 3 is shown with a reverse taper (i.e., smallest diameter in the initial region grown and largest diameter in the portion grown just before connecting to the surface 14). This reverse taper may be achieved by using a lower ratio of silane to chlorine-containing gas such that the net radial growth rate is negative (i.e., etching, rather than depositing). It is to be understood that the characteristics of the previously grown segments 22, 24 may advantageously be adjusted to account for this etching.

Either of the previously described techniques produces substantially mechanically stable segments 22, 26 with broader regions near the connections to the surfaces 12, 14, and narrower diameters near the selectively removable segment 24 (which, as previously described, is subsequently removed to form the gap 28).

It is to be understood that some embodiments of the nanowire device include at least one tapered segment 22, 26 and at least one segment 26, 22 having a substantially uniform diameter. In one embodiment, the length of the segment 26, 22 having the substantially uniform diameter is shorter than the length of the tapered segment 22, 26. This may advantageously reduce the force (from subsequently introduced fluids) exerted on the segment 26, 22 having the substantially uniform diameter.

Referring now to FIGS. 2C and 2D, embodiments of the method further include introducing the material 30 in at least a portion of the gap 28 to form one embodiment of the device 10 (FIG. 2C), 10' (FIG. 2D). The material 30 may be formed by introducing a fluid (i.e., gas or liquid) that is formed of, or contains, a material of interest, into the gap 28. In one embodiment, the material 30 is assembled in situ when the material of interest is introduced into the gap 28 and adheres or attaches to one or both of the nanowire segments 22, 26 (at ends E) bounding the gap 28. In an embodiment, the material 30 may include components having a predetermined shape, size and/or configuration (e.g., pre-formed concentric spheres sized suitably for the gap 28) that are suspended in a fluid. In non-limiting examples, the material 30 of interest covalently (or otherwise) bonds to the ends E of the respective segment(s) 22, 26, adsorbs on the ends E of the respective segment(s) 22, 26, or combinations thereof.

It is to be understood that the material 30 selected may depend, at least in part, on the ultimate use of the device 10, 10'. Non-limiting examples of suitable materials include molecules and/or coated nanoparticles (e.g., having electronic or optical characteristics), materials having a changeable conductance (e.g., when exposed to heat and cooled at various rates), oxides, metals, one-dimensional quantum structures (e.g., quantum dots), colloidal spheres, and/or various combinations thereof. One material or a combination of materials may be selected to form the material 30.

The position of the material 30 in the gap 28 may be controlled chemically, electrically, or via combinations thereof. As shown in FIG. 2C, one embodiment of the method includes positioning the material 30 adjacent one of the segments 22, 26 without closing the gap 28. In this embodiment of the device 10, the material 30 is asymmetrically positioned in the gap 28. As shown in FIG. 2D, another embodiment of the method includes positioning the material 30 such that it substantially closes the gap 28 and is adjacent both of the segments 22, 26. It is to be understood that the chemical or electrical properties of the material 30 may be anisotropic.

Chemically positioning the material 30 in the gap 28 may be accomplished by selecting a material 30 that has an affinity for one or both of the respective ends E of the nanowire segments 22, 26 adjacent the gap 28. In one embodiment, the segments 22, 26 may be formed of chemically similar materials, and the material 30 may be formed of a material that binds to both of the segments 22, 26 (e.g., FIG. 2D). In this embodiment, the material 30 may be made up of, for example, a plurality of molecules that bind to each other, in addition to binding to the nanowire segments 22, 26. In another embodiment, the segments 22, 26 may be formed of chemically distinct materials, and the material 30 may be formed of a material that has a tendency to bind to one of the segments 22, 26 (e.g., FIG. 2C). In still a further embodiment, the segments 22, 26 may be formed of chemically distinct materials, and the material 30 may be formed of a material(s) (e.g., material X) that has a tendency to bind to one of the segments 22, 26, and another material(s) (e.g., material Y) that has a tendency to bind to the other of the segments 26, 22. In the latter embodiment, a monolayer of material X may bind to segment 22, a monolayer of material Y may bind to segment 26, and the materials X, Y may either i) bind to each other, ii) have a smaller gap than gap 28 therebetween, or iii) mix together between the two monolayers, thereby forming a material 30 composed of multiple materials of interest.

Electrically positioning and/or orienting the material 30 may be accomplished by selecting a material that has one or more electrical properties (e.g., dipole) that respond to an applied electric field. As an example, the electric field may position the material 30 adjacent one or more of the segment 22, 26 ends E, and may orient the dipole of the material 30 in a particular direction. As a non-limiting example, the nanowire segments 22, 26 may be formed of the same material, and an electric field may be applied as the material 30 is introduced into the gap 28. The resulting position and/or orientation depend, at least in part, on the direction of the applied electric field. Without being bound to any theory, it is believed that if the electric field is sufficiently strong, the material(s) (forming the material 30) may not substantially bind to other surfaces S of the segments 22, 26, except at ends E located adjacent the gap 28. Application of an electric field during assembly of the material 30 in the gap 28 may also result in the asymmetric transport of electrons to the gap 28, and/or the accelerated growth of the material 30 across the gap 28, as the electric field may draw additional material 30 into the gap 28 or orient material 30 in a suitable direction for attachment.

In one embodiment, the crystallographic orientation of the nanowire segments 22, 26 at the surface S and at the ends E may affect the positioning of the material 30 in the gap 28. The ends E of the nanowire segments 22, 26 may have the same crystal orientation as the surface 12, 14 from which the nanowire 18 is grown. The other surfaces S of the nanowire segments 22, 26 may have different crystal orientations than the surface 12, 14. As such, the material 30 may be selected to have an affinity to the crystal orientation of the ends E.

FIG. 4 depicts an embodiment of the nanowire 18 having two segments 22, 24, one of which is the selectively removable segment 24. As shown in FIG. 4, the selectively removable segment 24 is formed at the end of segment 22 and adjacent the surface 14. In another embodiment (not shown), the selectively removable segment 24 is formed adjacent the surface 12, and the nanowire segment 26 is formed at the end of the selectively removable segment 24 and adjacent surface 14. The surface 12, 14 at which the selectively removable segment 24 is formed depends, at least in part, on the desirable position of the gap 28. It is to be understood that embodiments for forming the nanowire segments 22, 24, 26 described hereinabove may be used to form embodiments similar to that shown in FIG. 4. It is to be further understood that the gap 28 may be formed, and material 30 may be positioned in the gap 28 as described herein.

Referring now to FIG. 5, another embodiment of the device 10" is depicted. In this embodiment, the surfaces 12, 14 are formed in the top silicon layer of a silicon-on-insulator substrate (not shown), and the nanowire 18 is grown from one of the surfaces 12, 14. During nanowire 18 growth or subsequent to nanowire 18 growth, a protective layer 32, 32' may form, or be deposited on the surfaces S of the nanowire segments 22, 26, respectively. The formation of the protective layer 32, 32' generally results when certain materials are selected for the nanowire segments 22, 26 (e.g., silicon) and/or the segments 22, 26 are subjected to suitable processing (e.g., exposure to an oxygen containing atmosphere at a suitable temperature). It is to be understood that the protective layer 32 may be the same as, or different from protective layer 32'. Further, it is to be understood that protective layer 32, 32' may be any suitable material. In an embodiment, protective layer 32, 32' includes oxides, nitrides, or the like, or combinations thereof. Yet further, it is to be understood that protective layer 32, 32' may be included in any of the embodiment(s) described herein.

It is to be understood that an additional layer (not shown) may also form on the selectively removable segment 24 during growth. One non-limiting example of such an additional layer is germanium oxide forming on a selectively removable segment 24 formed of germanium. In this example embodiment, germanium oxide is water-soluble, while silicon oxide (e.g., formed on silicon segments 22, 26) is not. The material for the selectively removable segment 24 may be selected such that the additional layer is easily removable compared to the protective layer 32. In other embodiments, the material for the selectively removable segment 24 may be selected such that an additional layer does not form on a surface thereof during growth, or during subsequent processing that forms the protective layer 32 on segments 22, 26.

During formation of the device 10", when the selectively removable segment 24 is removed, the ends E of the respective nanowire segments 22, 26 adjacent the gap 28 are exposed. As shown in FIG. 5, the protective layer 32, 32' is not formed on these ends E. As such, the material 30 may be selected to adhere to the exposed ends E of the segments 22, 26, and not to protective layer 32, 32', thereby substantially ensuring formation of the material 30 in the gap 28.

FIG. 5 also depicts a material 30 formed of three different materials A, B, C. As previously described, the materials A, B, C may be chemically or electrically oriented in the gap 28. In one embodiment, material A is selected to adhere to segment 22, material C is selected to adhere to segment 26, and material B is selected to adhere to materials A and C. In another embodiment, materials A and C may be formed such that they contact each other. As little as a single monolayer of one of the materials A or C may be removed controllably (e.g., chemically or electrically) to form a gap between the remaining materials A and C. Material B, which is selected to bind with both materials A and C, may be introduced to bridge materials A and C.

FIG. 6 depicts still another embodiment of the device 10'''. In this embodiment, the nanowire 18 is grown vertically between a substrate 16 and a previously formed layer 16', using method(s) previously described. This embodiment of the device 10''' also depicts an additional segment 34 of the nanowire 18. As previously described, additional segments 34 may be formed by changing the material and/or dopant concentration during formation of the nanowire 18.

While various methods and systems have been discussed for positioning the material 30 within the gap 28 without establishing the material 30 on the surfaces S of the segments 22, 26, 34, it is to be understood that some of the material(s) 30 may react with, adsorb on, and/or bind to the nanowire surfaces S. It is contemplated that, in some instances, establishing the material 30 on the surfaces S will not deleteriously affect the device 10, 10', 10", 10'''.

As previously stated, the embodiments of the device 10, 10', 10", 10''' disclosed herein may be suitable for use in a variety of applications. This is due, at least in part, to the range of materials 30 that may be positioned in the gap 28. As non-limiting examples, the device(s) 10, 10', 10", 10''' may be sensors (e.g., chemical sensors), devices for studying molecules, electronic devices (e.g., embodiments having material 30 asymmetrically formed in the gap 28 may function as diodes), photo- or opto-electronic devices, or the like, or combinations thereof. In one embodiment, the device 10, 10', 10", 10''' is used as a sensor. In this embodiment, the material 30 may have one or more properties that are sensitive to predetermined conditions (e.g., heat, voltage, light, etc.). As such, when the device 10, 10', 10", 10''' is exposed to such conditions, the one or more properties (e.g., electrical, optical, etc.) of the material 30 changes, and such a change is measurable. As non-limiting examples, a voltage may be applied to change an electrical property of the material 30, and changes in current may be detected; a voltage may be applied to change the chemical structure of the material 30, and such changes may be sensed optically (e.g., Raman measurements); light may be applied to the material 30, and changes in resistance, conductance or current flow may be detected.

In addition to being suitable for forming devices 10, 10', 10", 10''' for use in a variety of applications, embodiments of the method disclosed herein also include, but are not limited to the following advantages. The methods advantageously provide an element of control over both the position of the gap 28 and the length of the gap 28. Such control also enables the reproducibility of particular device 10, 10', 10", 10''' elements, and the flexibility to change the device 10, 10', 10", 10''' as desired.

While several embodiments have been described in detail, it will be apparent to those skilled in the art that the disclosed embodiments may be modified. Therefore, the foregoing description is to be considered exemplary rather than limiting.

What is claimed is:

1. A nanowire device, comprising:
   a nanowire formed between two surfaces;
   a gap formed at a predetermined location in the nanowire; and
   a protective layer established on each surface of the nanowire without being established on ends of the nanowire adjacent to the gap or adjacent to the two surfaces.

2. The nanowire device as defined in claim 1, further comprising a predetermined material formed in at least a portion of the gap.

3. The nanowire device as defined in claim 1, wherein the predetermined material is selected from a material having a changeable conductance, molecules, coated nanoparticles, oxides, metals, one-dimensional quantum structures, colloidal spheres, and combinations thereof.

4. The nanowire device as defined in claim 1 wherein the gap has a substantially controllable predetermined length.

5. The nanowire device as defined in claim 4 wherein the substantially controllable predetermined length is of a substantially similar order as a diameter of the nanowire.

6. The nanowire device as defined in claim 2 wherein the predetermined material is chemically positioned in the at least a portion of the gap, electrically positioned in the at least a portion of the gap, or combinations thereof.

7. The nanowire device as defined in claim 6 wherein the predetermined material is asymmetrically positioned in the gap.

8. The nanowire device as defined in claim 1 wherein the nanowire is positioned laterally or vertically between the two surfaces.

9. The nanowire device as defined in claim 1 wherein each surface is a surface of an electrode.

10. The nanowire device as defined in claim 1 wherein the nanowire includes two segments separated by the gap, wherein at least one of the two segments has a tapered diameter, and wherein a portion, with a larger diameter, of the at least one of the two segments is adjacent the respective surface.

11. A method of forming a nanowire device, the method comprising:
    establishing a nanowire having a selectively removable segment between two surfaces;
    removing the selectively removable segment, thereby forming a gap in the nanowire; and
    establishing a protective layer on each surface of the nanowire without being established on ends of the nanowire adjacent to the gap or adjacent to the two surfaces.

12. The method as defined in claim 11, further comprising introducing a predetermined material in the gap.

13. The method as defined in claim 12 wherein introducing the predetermined material in the gap is accomplished by introducing a fluid of, or containing a predetermined material into the gap, whereby the predetermined material adheres to at least one segment of the nanowire.

14. The method as defined in claim 13, further comprising positioning the predetermined material in the gap by selecting a predetermined material having an affinity for the at least one segment of the nanowire or by selecting a segment material having an affinity for the predetermined material.

15. The method as defined in claim 13 wherein the predetermined material has a dipole, and wherein the method further comprises positioning or orienting the predetermined material or electrical properties thereof in the gap by applying an electric field to the device as the fluid of the predetermined material is introduced.

16. The method as defined in claim 11 wherein establishing the nanowire is accomplished by:
    growing a first segment of the nanowire from one of the two surfaces;
    growing the selectively removable segment from the first segment; and
    growing a second segment of the nanowire from the selectively removable segment.

17. The method as defined in claim 16 wherein the selectively removable segment has an etch rate that is different from an etch rate of each of the first and second segments.

18. The method as defined in claim 16 wherein growing the selectively removable segment includes changing a material or changing a dopant concentration after the first segment is grown.

19. A method of using the device of claim 2, the method comprising:
    exposing the predetermined material to a predetermined condition, thereby causing a change in a property of the predetermined material; and
    measuring the change in the property.

20. The method as defined in claim 19 wherein the predetermined condition is selected from heat, voltage, light and combinations thereof, and wherein the property is selected from an electrical property, an optical property, and combinations thereof.

* * * * *